United States Patent [19]

Kean

[11] Patent Number: 5,701,091
[45] Date of Patent: Dec. 23, 1997

[54] ROUTING RESOURCES FOR HIERARCHICAL FPGA

[75] Inventor: Thomas A. Kean, Edinburgh, Scotland

[73] Assignee: Xilinx, Inc., San Jose, Calif.

[21] Appl. No.: 482,339

[22] Filed: Jun. 6, 1995

[30] Foreign Application Priority Data

May 2, 1995 [GB] United Kingdom ......... S.N.9508931.4
May 2, 1995 [GB] United Kingdom ......... S.N.9508933.0

[51] Int. Cl.$^6$ .............................................. H03K 19/177
[52] U.S. Cl. ................................................................ 326/41
[58] Field of Search ............................ 326/38, 39, 41

[56] References Cited

U.S. PATENT DOCUMENTS

| 5,019,736 | 5/1991 | Furtek | 326/41 |
| 5,208,491 | 5/1993 | Ebeling | 326/41 |
| 5,218,240 | 6/1993 | Camarota | 326/41 |
| 5,448,186 | 9/1995 | Kawata | 326/41 |
| 5,512,765 | 4/1996 | Gaverick | 326/41 |

FOREIGN PATENT DOCUMENTS

WO 94/10754  5/1994  WIPO ................ H03K 19/17

Primary Examiner—Edward P. Westin
Assistant Examiner—Benjamin D. Driscoll
Attorney, Agent, or Firm—Edel M. Young; Adam H. Tachner, Esq.; Crosby, Heafey, Roach & May

[57] ABSTRACT

In an FPGA having a hierarchical routing structure, additional routing lines are provided which have different destinations for different cells within a block. A pattern is chosen which allows signal lines to turn corners conveniently. In one embodiment having cells arranged into 4×4 blocks, cells on the diagonal of a block generate signals which are provided to switches which form one boundary of the block.

2 Claims, 11 Drawing Sheets

5,701,091

ROUTING RESOURCES FOR HIERARCHICAL FPGA

FIELD OF THE INVENTION

The invention relates to integrated circuits, more particularly to field programmable logic devices (FPGAs) having a programmable core of logic, a configuration memory for programming the core logic, logic for programming the configuration memory, and pad drivers for interfacing to external pads and pins.

BACKGROUND OF THE INVENTION

Reprogrammable FPGAs have been available commercially for several years. The best known commercial family of FPGAs are those from Xilinx, Inc. One class of these devices uses Static Random Access Memory (SRAM) cells to hold control bits which control their configurations. Each SRAM cell controls one or more transistors at the configurable points in an FPGA or serves as one or more entries in a lookup table. (The configuration memory cells collectively determine what functions the FPGA will implement.)

The present invention will be described in connection with SRAM FPGAs. The configuration of the FPGA is typically loaded from a non-volatile configuration memory into the SRAM configuration memory cells when power is applied to the system.

An FPGA having a hierarchy of line lengths is shown in FIG. 1, where line 34 is 16 cells long (only partly shown) going east, line 26 is four cells long going east, line 22 is one cell long going east and line 24 is one cell long going west. Switches 18 and 20 in the interior core of the user logic shown in FIG. 1 comprise a plurality of multiplexers each programmable by bits in a configuration memory to connect their input and output signals as desired by a user. This is hierarchical interconnect structure is discussed in more detail in Patent Cooperation Treaty patent application serial No. WO 94/10754 published 11 May 1994 [docket MA-002].

FIG. 2 shows a structure at the edge of this FPGA chip including a pad 16, the related pad driver 18, and a switch 15 in the user logic. In FIG. 2, switch 15, which in FIG. 2 is located at the east edge of the FPGA, sends and receives signals between user logic at the left and the external pad 16 and pin 17 at the right. Lines extending to the left of switch 15 are of three different lengths as indicated by their numerical representation. For example, line E16B is 16 cells long and carries signals in the east direction, line E4B is four cells long going east, and line EB is one cell long going east. Line WB is one cell long going west.

FIG. 3 shows the internal structure of the pad driver 18 and the related switch of FIG. 2. As shown in FIG. 3, switch 15 includes eight multiplexers 41 through 48, each for providing one of the output signals WB, W4B, W16B, WA, W4A, W16A, EN, and OUT. Input signals to these eight multiplexers are selected from the east-going input signals E16B, E4B, EB, E16A, E4A, EA, and the pad signal PADIN provided by pad driver 18.

Also shown in FIG. 3, pad driver 18 includes tristate output buffer 78 for providing output signal OUT to pad 16 under control of enable signal EN. The slew rate (switching speed) of output buffer 78 is also selectable by the user through memory cell SLEW. If pad driver 18 is configured to serve as an input driver, EN is set to make buffer 78 inactive. In the event that the chip is put into a package in which no pin 17 is connected, pullup control transistor TPUP is turned on by memory cell PUP to connect pullup resistor RPUP to the input terminal of input buffer 79 so the input voltage will not float to an intermediate state and drain power.

In FIG. 3, dashed lines are used to indicate configuration memory cells which control multiplexers and transistors in the switch and pad driver. The dashes suggest that the configuration memory cells are not visible in the picture. (One can envision the memory cells are part of a memory array on a lower plane.) In some cases, the memory cell is not directly connected to the multiplexer or transistor as shown, but is gated, for example through an AND gate which typically receives a global enable input. Signals from the memory cells which control the pullup transistor and slew rate on the output buffer are typically gated, and enable multiplexer 47 is typically controllable to provide a disabling output signal regardless of the values in its configuration memory cells. Such gating structures are not shown but are well known.

If a bus is to be widely distributed or fanned out through an FPGA, some structure is needed to enable the bus to conveniently turn corners.

SUMMARY OF THE INVENTION

According to the invention, the cells within a block include a multiplexer with an output line, sometimes called a magic multiplexer with a magic output line, each of which has a destination dependent upon the position of the cell within the block. In one embodiment, the cells which are on a diagonal of the block all have destinations which are switches at the same boundary of the block. The multiplexers receive input signals from switches at all boundaries of the block, and thus allow a bus to turn a corner conveniently. In another embodiment, each magic line is routed to two switches at two different edges of the block. Yet another embodiment combines these features, routing diagonals to one edge and routing all cells to two destinations. Cells not on a diagonal of the block can fan out signals, for example in two right angle directions. These magic multiplexers and lines are also useful for providing wide fan out signals such as clock and clear signals. A bus can also be rearranged or split conveniently using these magic multiplexers and lines.

DETAILED DESCRIPTION OF SOME EMBODIMENTS OF THE INVENTION

Figure 1:
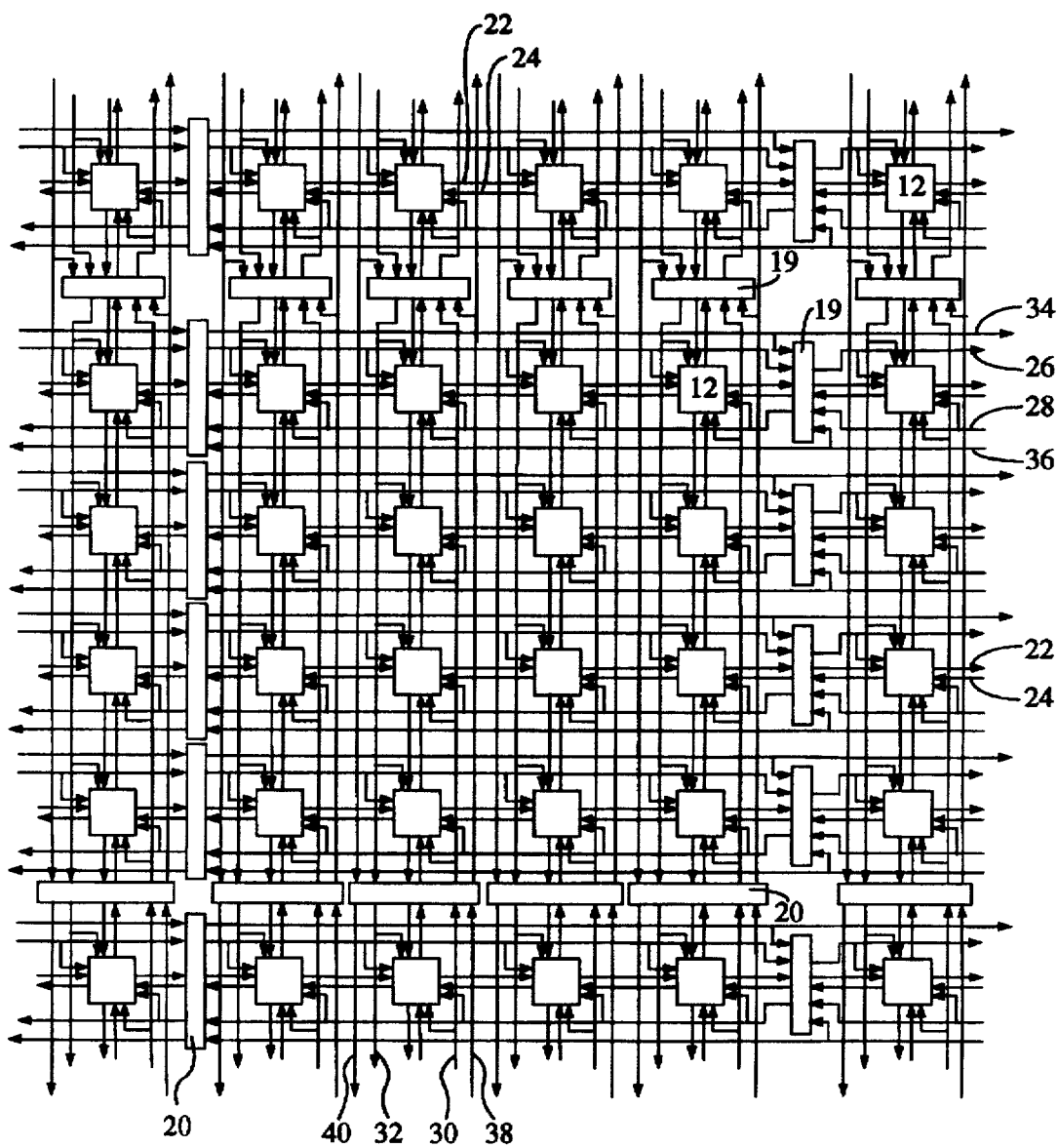
FIG. 1 shows a portion of user logic with which the invention may be used, illustrating a hierarchical interconnect structure.
Figure 2:
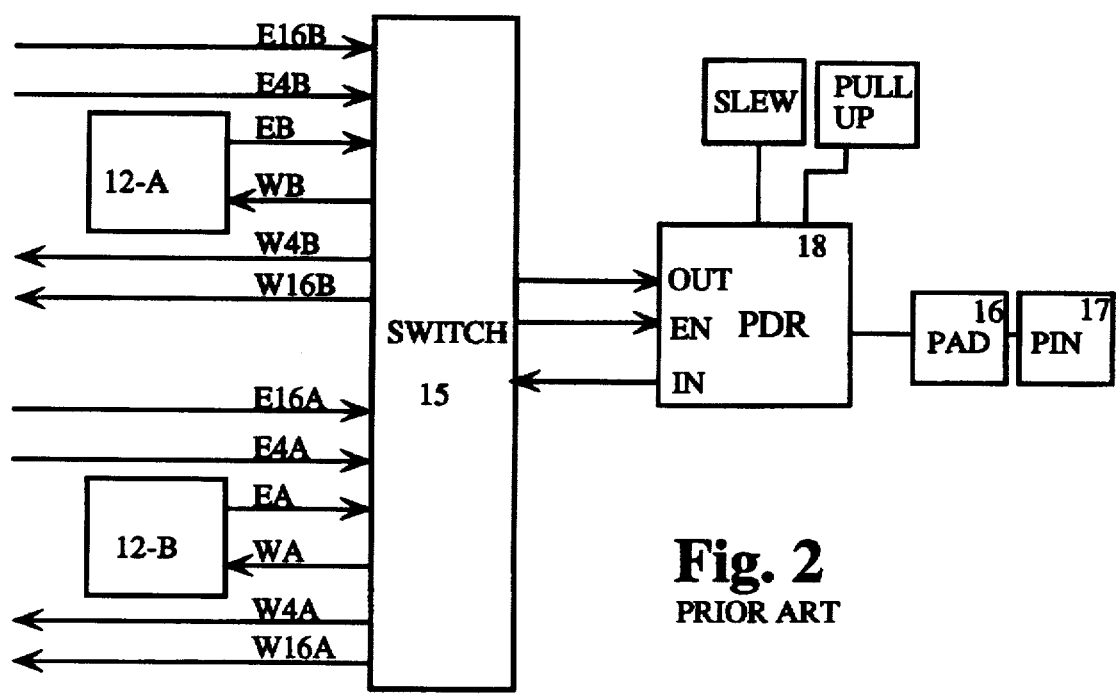
FIG. 2 shows the relationship between parts of the FPGA user logic of FIG. 1 and the chip periphery, namely a pad, the related pad driver, and a switch in the user logic.
Figure 4:
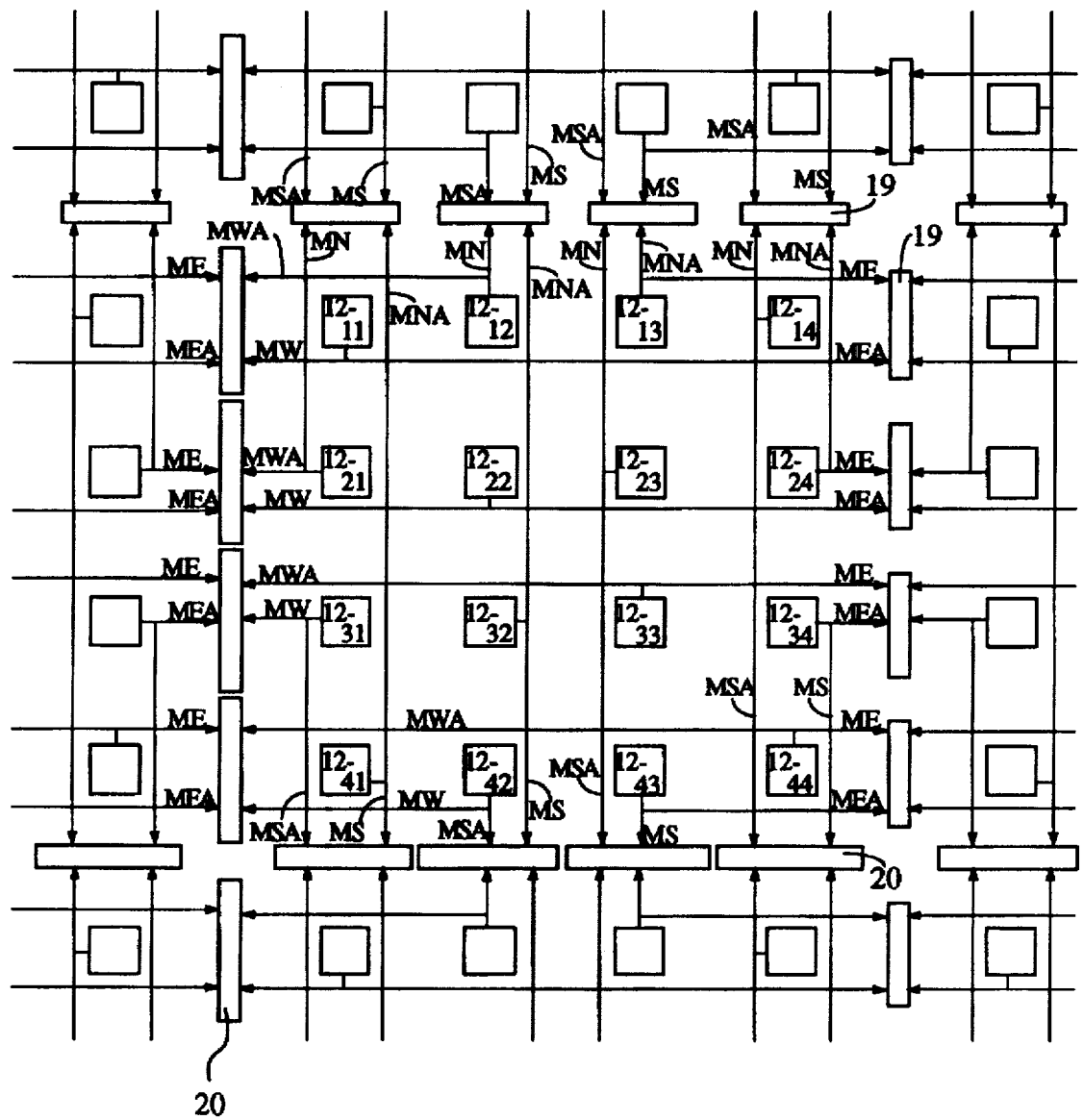
FIG. 4 shows a four-by-four cell block with the pattern of routing lines which connect the M output signals from a logic cell to switches surrounding the four-by-four cell block.

FIG. 4 shows a four-by-four cell block and shows the pattern of routing lines which connect the M output signals from a single cell 12 to switches surrounding the four-by-four cell block. The destination of the M output signal of FIG. 4 depends upon where cell 12 is positioned within the four-by-four cell block. As shown in FIG. 4, the M output signal from cell 12-11 at the upper left corner of a four-by-four cell group is provided to switches to the east and west of the four-by-four cell group. The M output signal from cell 12-12 is provided to switches to the north and west of the four-by-four cell group. The M output signal from cell 12-13 is provided to switches to the north and east of the four-by-four cell group. The M output signal from cell 12-14 is provided to switches to the north and south of the four-by-four cell group. In the second row, the M output signal from cell 12-21 is provided to switches to the north and west; from cell 12-22 to the east and west; from cell 12-23 to the north and south; and from cell 12-24 to the north and east. Similar sets of connections are provided for the third and fourth rows as shown. Thus, in the core of the chip, four M signals are provided to each switch. These are in addition to the signals illustrated in FIG. 1. The arrangement of connecting lines allows a bus to turn a corner from vertical or horizontal wires or to be rearranged or split. These turns are made without using up the length-one wires, as would have been necessary with only the structure of FIG. 1. This combination of connections adds only two horizontal metal lines per row of cells and two vertical metal lines per column of cells, so very little metal area is consumed. Further, the structure illustrated in FIG. 4 requires only one two-to-one multiplexer in each cell and thus consumes very little area.

Figure 5:
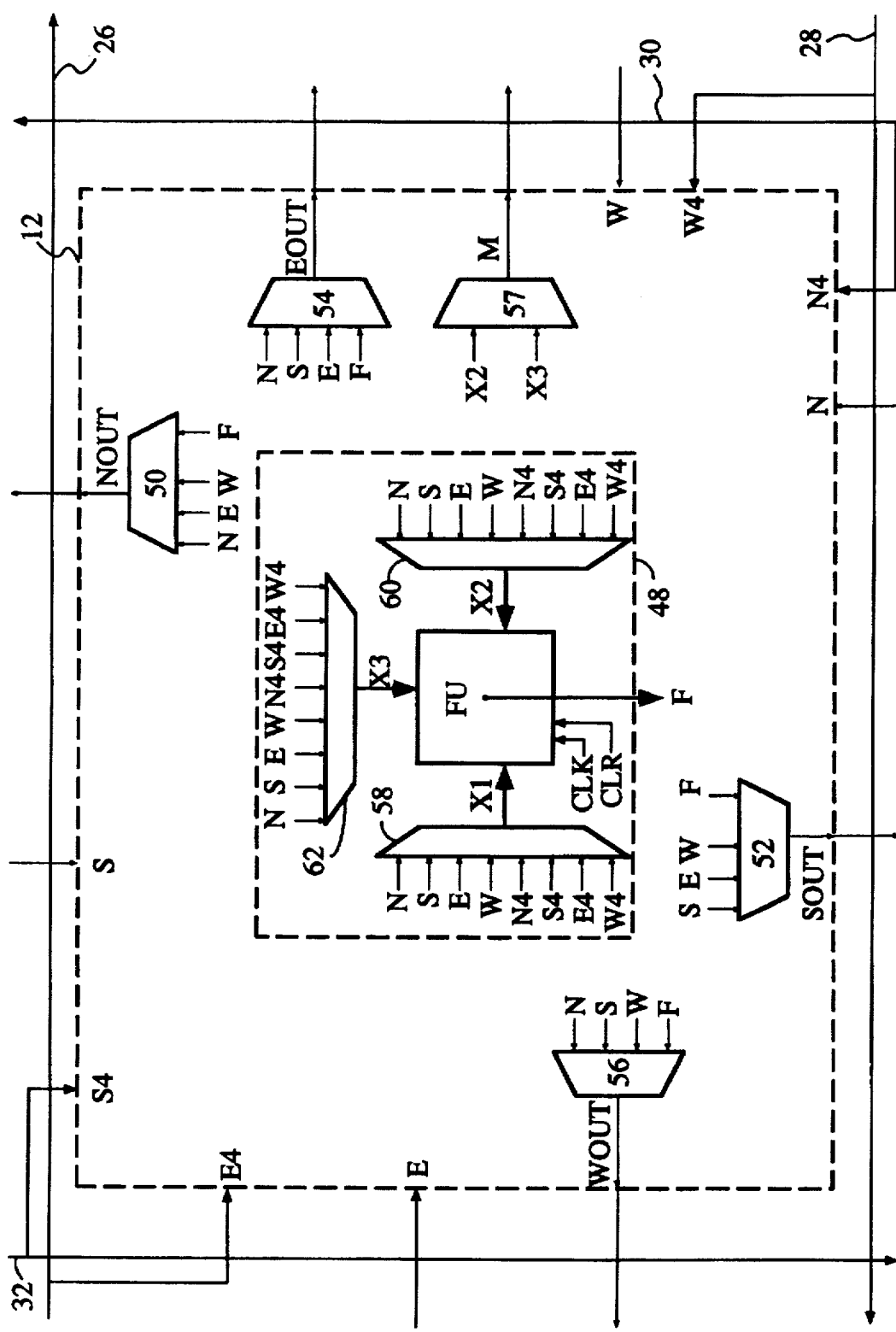
FIG. 5 shows a logic cell which generates the M signal placed on the M lines.

FIG. 5 shows the source of these M signals. As can be seen in FIG. 5, multiplexer 57 receives the X2 and X3 input signals, which can each be derived from length-one or length-four signals from any of the four directions. For example, in FIG. 4, cells 12-11, 12-22, 12-33, and 12-44 could derive signals from the south and direct these signals to the east or west. Likewise, cells 12-41, 12-32, 12-23, and 12-14 can derive signals from switches to the west and direct these signals to the north or south. Cells not on the diagonal of the four-by-four block can fan out signals in two right angle directions. The routing flexibility from adding multiplexer 57 and its related output lines requires only one additional memory cell in the configuration memory. Multiplexer 57 reuses signals X2 and X3 generated by multiplexers 60 and 62. Many cell functions do not require both the X2 and the X3 multiplexers, some cells have unused function units, and a function unit might already have selected the desired input line to drive X2 or X3. Thus, there is a good chance of having an X2 or X3 multiplexer output signal which can be used by multiplexer 57 with no sacrifice to other parts of a user's design. The routing flexibility from adding multiplexer 57 and its related output lines also helps the routability of random logic designs.

Figure 6:
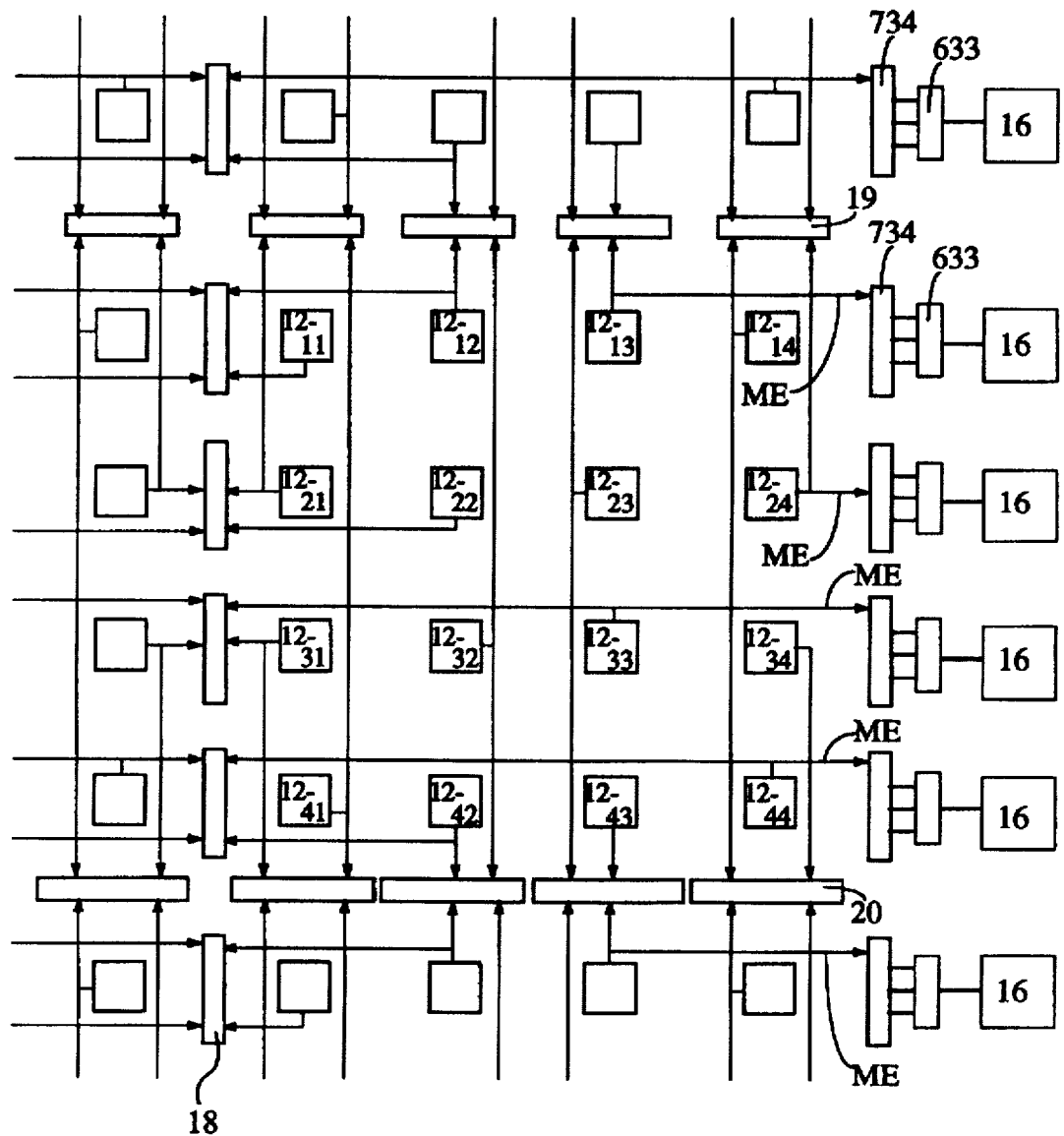
FIG. 6 illustrates the arrangement of M lines provided to switches 734 at the east edge of the chip.

FIG. 6 illustrates the arrangement of ME signals provided to switches 734 at the east edge of the chip. These are illustrated in FIG. 4 as signals ME. At the edge of the chip, only two signals would be provided to switch 734, since no logic cells exist between switch 734 and the pads. However, in one embodiment, only one M signal is provided to switch 734. Many other combinations are of course possible in other embodiments.

Figure 7A:
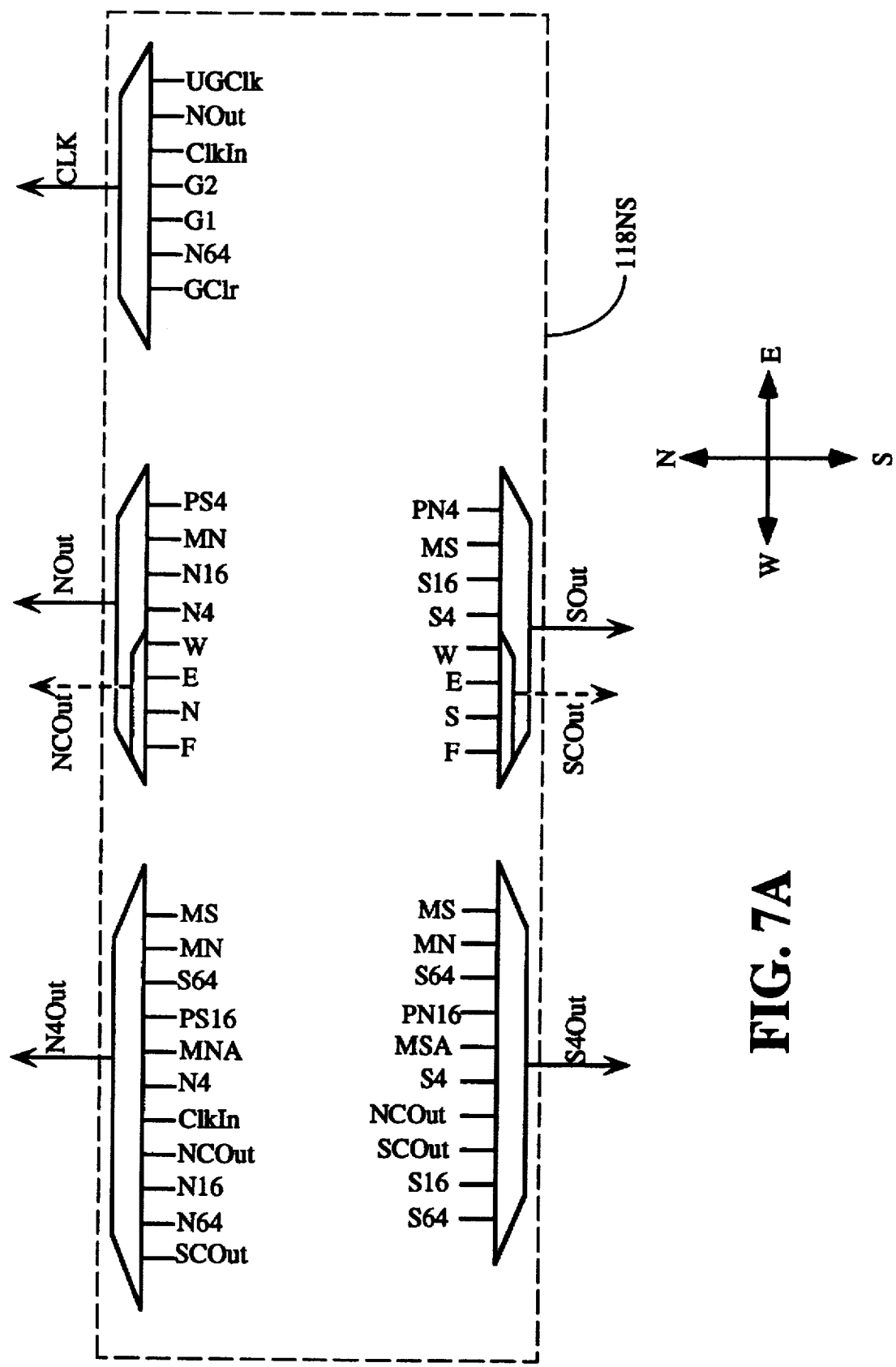
FIGS. 7A through 7D illustrate switches provided in one embodiment at locations throughout the user logic structure. These switches receive the M signals.
Figure 7B:
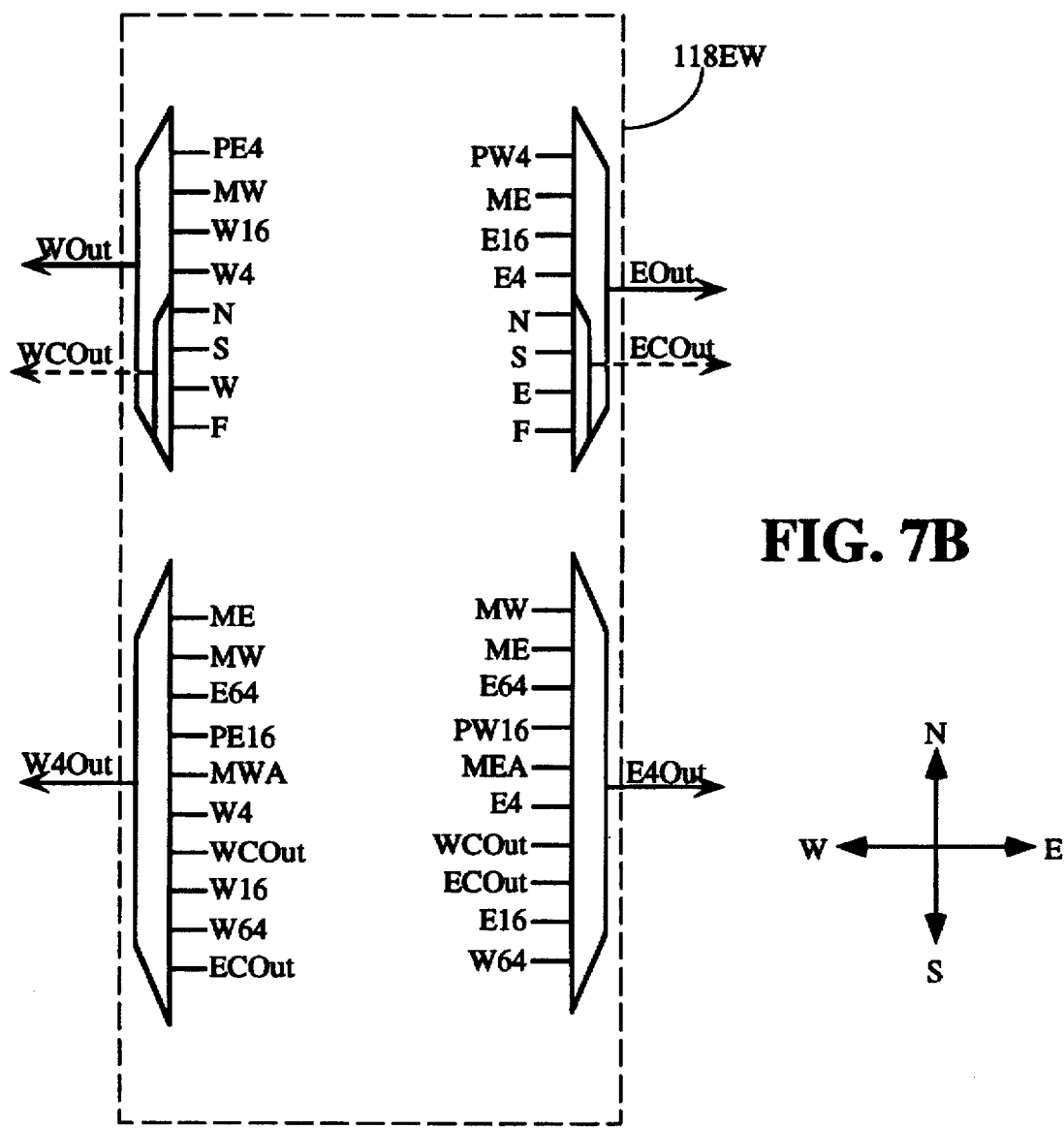
Figure 7C:
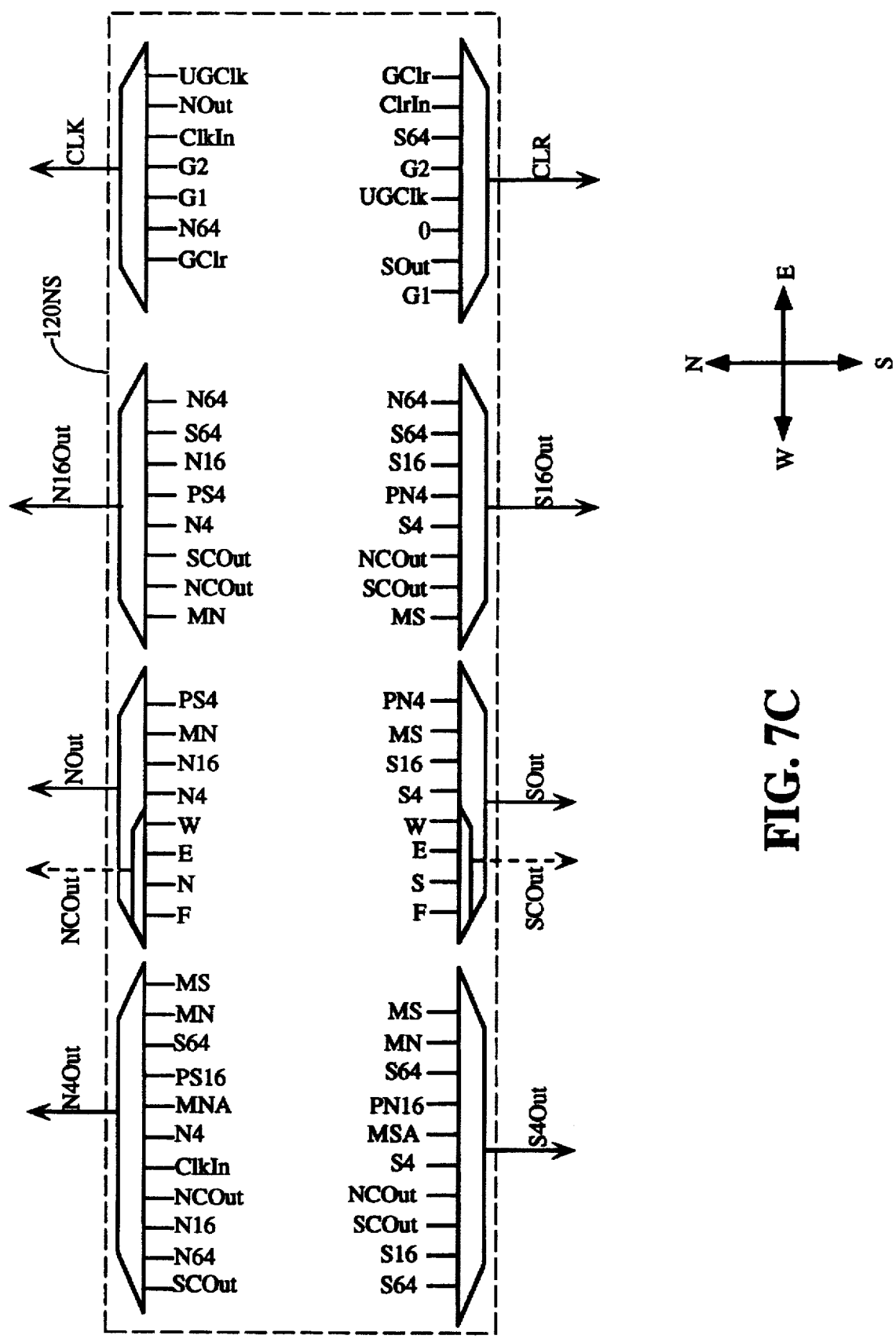
Figure 7D:
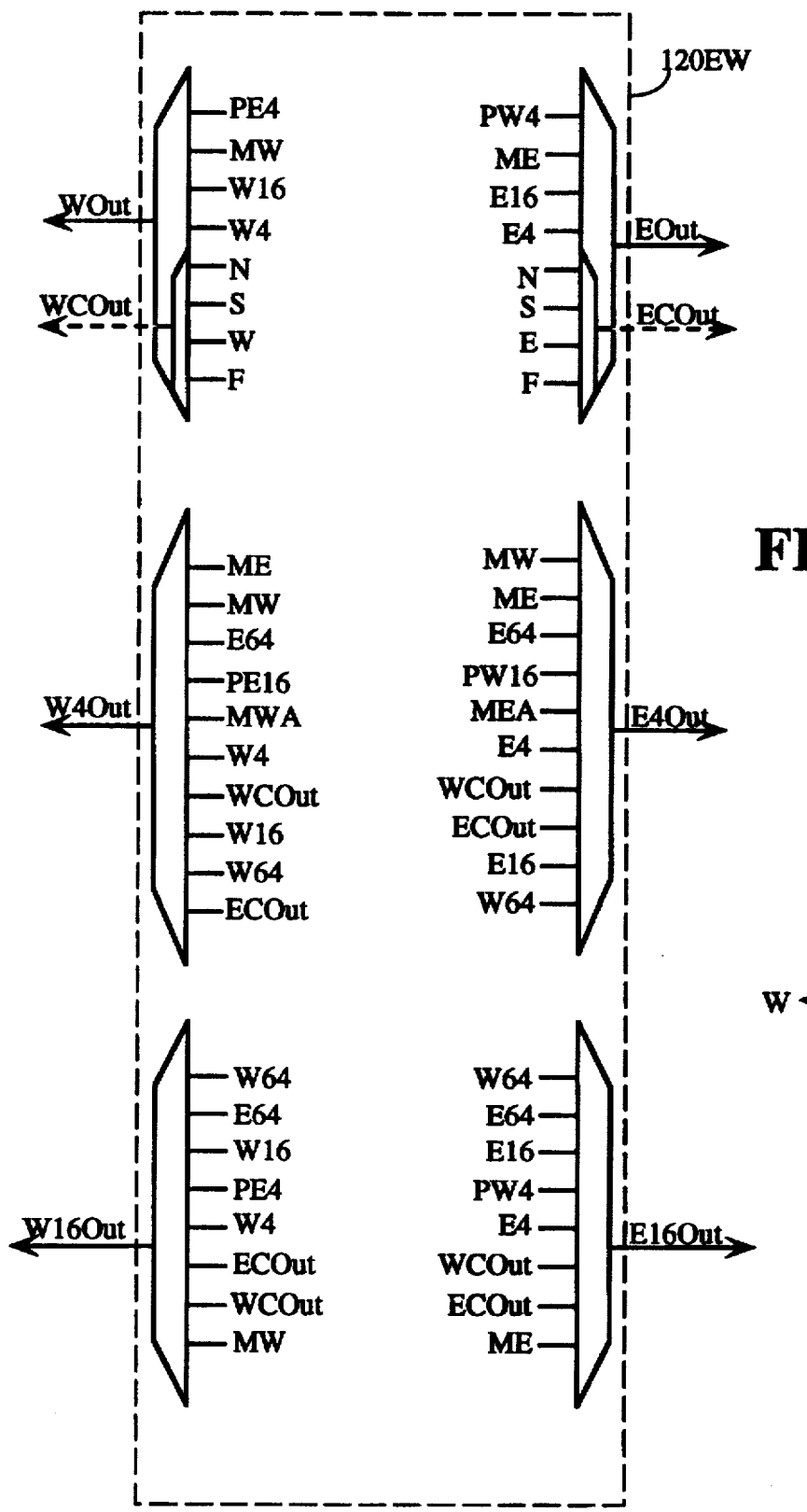

FIGS. 7A through 7D illustrate switches provided in one embodiment at locations throughout the user logic structure to define edges of blocks and to provide the hierarchical routing structure with which the invention is used. FIG. 7A represents a north south switch 118NS on a north-south boundary between 4×4 blocks of logic cells. Switch 118NS is similar to a switch 19 in FIG. 1. Switches 118NS form horizontal boundaries between 4×4 blocks of cells. FIG. 7B illustrates an east/west switch 118EW. Switches 118EW form east/west boundaries between 4×4 blocks of cells and routes signals of various lengths as shown. In FIG. 7C, a north/south switch 120NS is illustrated. Switches 120NS form horizontal boundaries between 16×16 blocks of cells. Similarly, switches 120EW, of which one is illustrated in FIG. 7D, form vertical boundaries between 16×16 blocks of cells.

In a preferred embodiment, the portions of switches of FIGS. 7A through 7D shown with dashed output lines are actually implemented as part of the neighboring logic cells shown in FIG. 5 and replace appropriate multiplexers in those neighboring cells.

In addition to routing signals of various lengths, these switches generate certain control signals. In FIG. 7A, switch 118NS generates a clock signal CLK, which drives the clock input CLK of user registers shown in FIG. 10 and can be derived either from the global clear signal GClr or from the gated user global clock signal UGClk illustrated in FIG. 12. The clock signal CLK from one switch is also provided as the signal ClkIn to the next switch directly north. User generated signals can be used as clock signals via the NOut input to the CLK multiplexer, and a clock signal CLK generated in one 4×4 block of cells can be used to drive a clock input in a cell to the north of the 4×4 block.

FIG. 7C shows a switch 120NS at a horizontal boundary of a 16×16 block of cells. In addition to routing multiplexers and the CLK multiplexer discussed above, switch 120NS includes a clear multiplexer which generates the clear signal CLR. As shown in FIG. 7C the clear signal CLR can be derived from a global clear signal GClr, from the clear signal generated in the block above ClrIn, from various routing signals, and from the global user-logic clock signal UGClk. signal UGClk.

Some of the multiplexers in FIGS. 7A through 7D are shown as providing a second optional output signal. For example, in FIG. 7A, the SOut multiplexer also provides an optional SCOut signal and the NOut multiplexer provides an optional NCOut signal. FIGS. 13B, 13C and 13D also show multiplexers with an optional second output signal having a "C" designation. This C output corresponds to the output that comes from the cell's neighbor multiplexer in FIG. 5. For example, in FIG. 7A, the NCOut signal is selected from the four signals F, N, E and W. Of the three select bits for controlling the eight-input NOut multiplexer, the two least significant bits also control the four-input NCOut multiplexer. Thus NOut will be identical to NCOut if the NOut multiplexer is set to select one of F, N, E or W. The same arrangement exists for the other multiplexers illustrated in FIGS. 7A through 7D as having a second output. The PS4 input to the NOut multiplexer is taken from the S4 signal to the cell to the north of the cell in which the NOut multiplexer is formed (not the S4Out signal from the illustrated switch). In every case the prefix "P" indicates the input signal comes from a previous cell (upstream from the direction of signal flow).

FIGS. 7A through 7D show only one embodiment of switches usable with the invention. Clearly many alternative variations on these switches can be provided.

Figure 3:
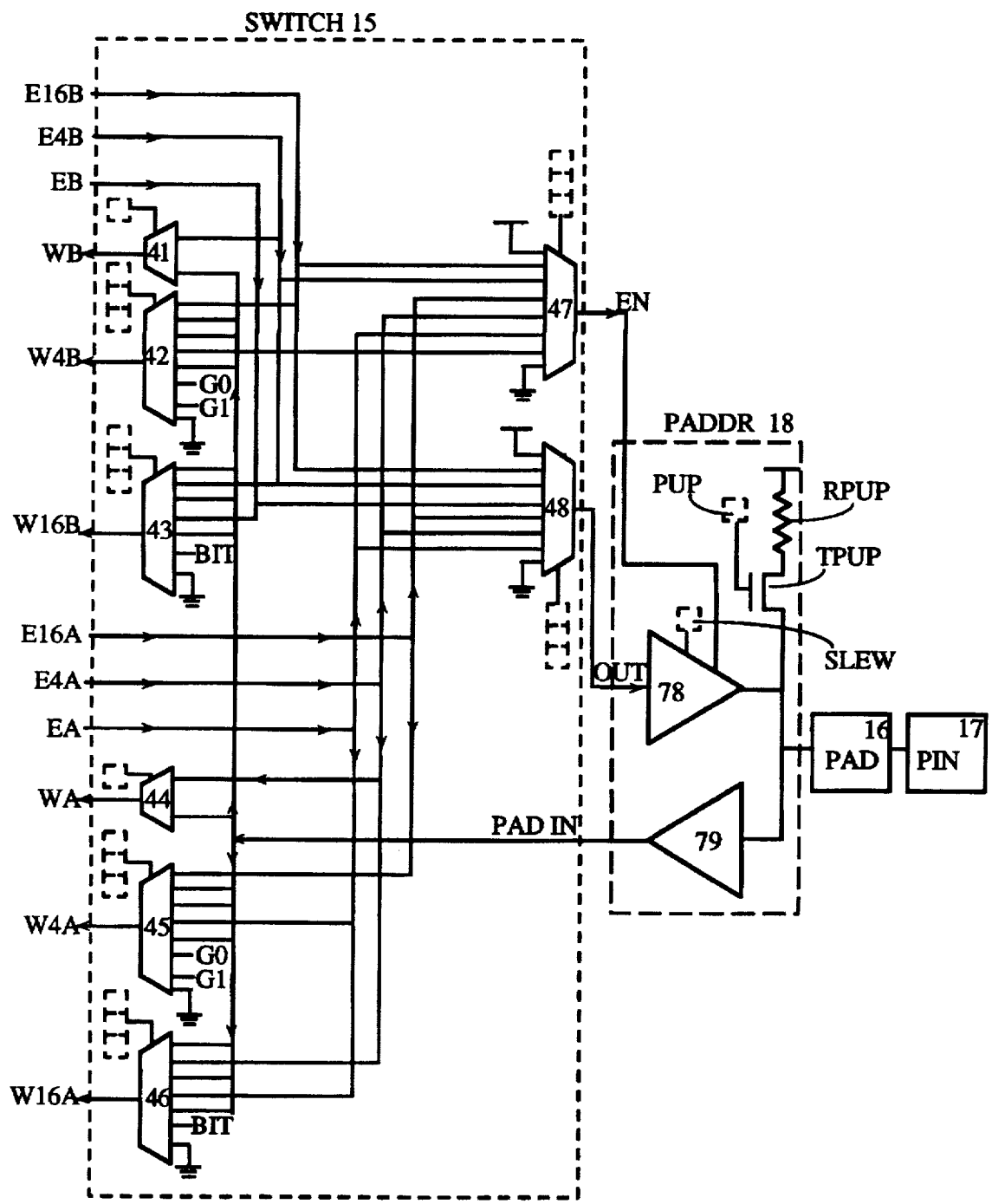
FIG. 3 shows the internal structure of the pad driver and the related switch of FIG. 2.
Figure 8A:
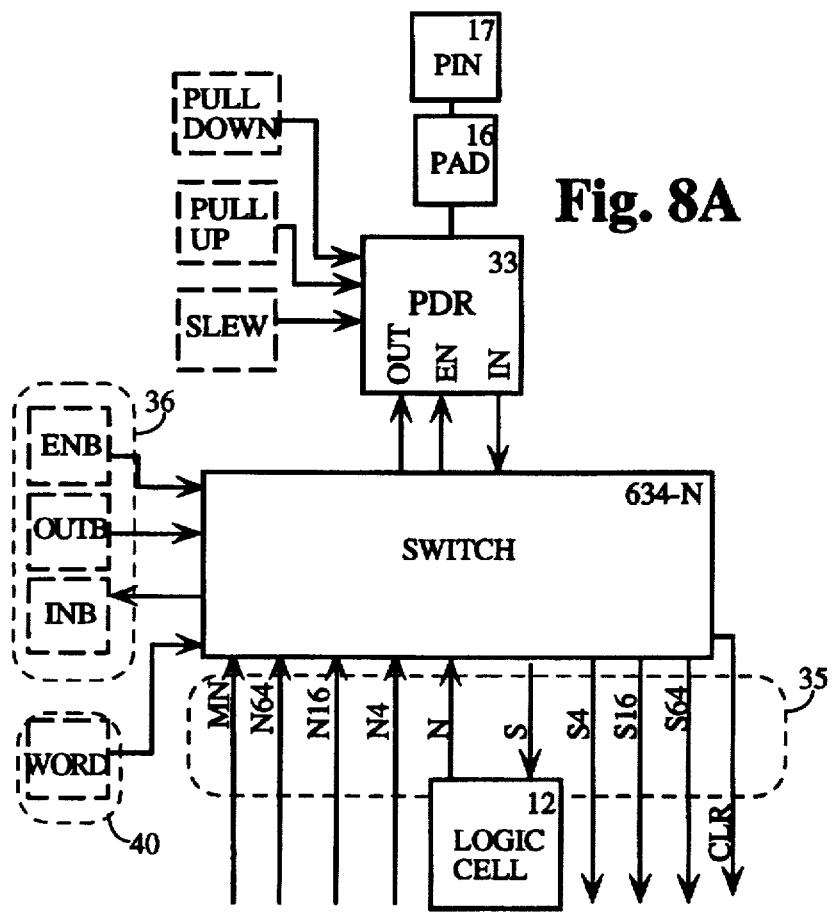
FIG. 8A shows a pad at the north edge of the FPGA, the related pad driver, a programmable switch at the north edge of the user logic, and signals accessed by the programmable switch.

FIG. 8A shows in more detail the relationship provided by the invention between parts of the FPGA, namely a pad at the north edge of the FPGA, the related pad driver 33, a programmable switch 634-N in the user logic, and signals accessed by the programmable switch 634-N. Pad driver 33 is controlled by three control signals PULL DOWN, PULL UP, and SLEW derived from three configuration memory cells, in a way similar to the structure of FIG. 3. Switch 634-N at the north edge of the chip receives three input signals derived from three lines which control the configuration memory. Signal INB in one embodiment can be used to provide a data signal on a data line which writes to the configuration memory and signal OUTB can be derived from that same data line. The ENB signal is derived from a control unit for controlling configuration memory in response to well-known signals such as clock, read/write, and chip enable signals. The WORD signal is derived from a word line in the configuration memory. In this embodiment, word lines extend vertically through the chip are accessed by switches at the north and south edges of the chip. Signal lines extending downward from switch 634-N connect to a user logic array such as shown in FIG. 4. The embodiment of FIG. 8A differs from that of FIG. 1 in that it includes a fourth level of hierarchy having routing lines N64 and S64 which are 64 cells long. Additionally line MN is of a length between one and four cells, and connects to a selected point in a four-cell block, as was discussed in connection with FIGS. 5 and 4.

Figure 8B:
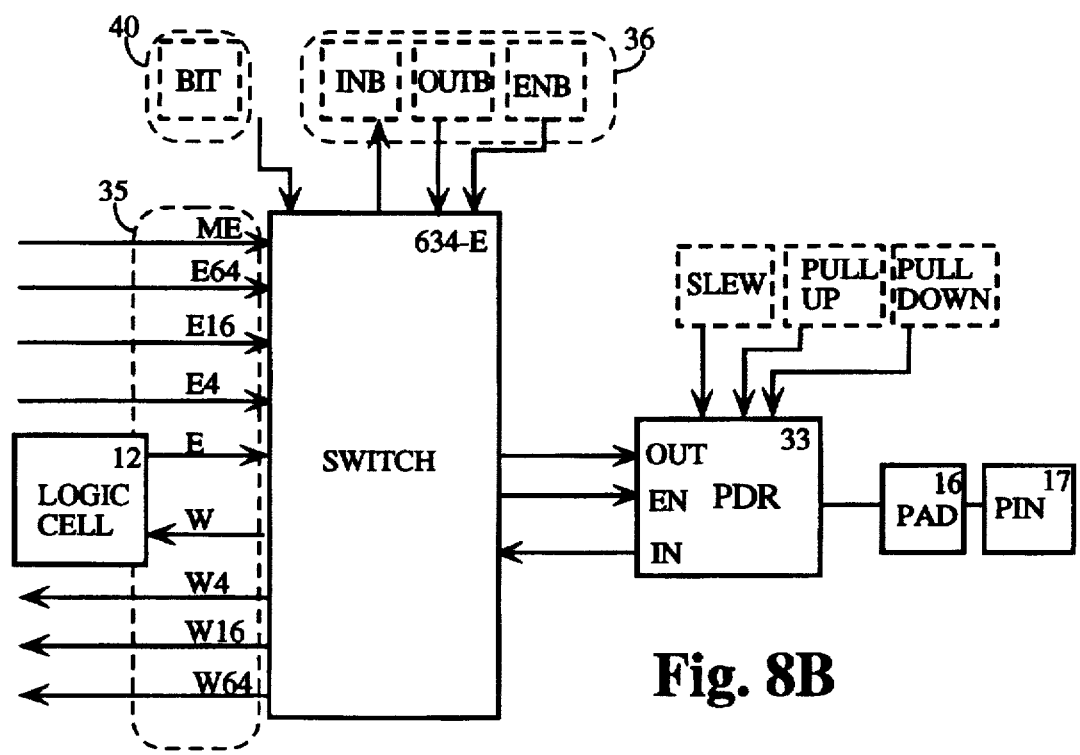
FIG. 8B shows a pad at the east edge of the FPGA, the related pad driver, a programmable switch at the east edge of the user logic, and signals accessed by the programmable switch.

FIG. 8B shows the relationship between a pad at the east edge of the FPGA, the related pad driver, a programmable switch in the user logic, and signals accessed by the programmable switch. In switch 634-E of FIG. 8B, signals from the programming structure include a bit line rather than a word line.

I claim:

1. A programmable logic device comprising:

a plurality of cells arranged in an array in said programmable logic device;

a plurality of routing lines, said routing lines extending in north-south or east-west directions;

a plurality of switches grouping said cells into a plurality of blocks of cells;

at least one multiplexer in each of said cells which takes inputs from a plurality of signals coming into said cell and provides an output signal, the output signals from multiplexers in one of said blocks being connected to at least one of said switches, the choice of which switch being determined by the position of said cell in its block;

each of said cells within said one of said blocks being connected to at least one switch via a wire, said wire being connected to no other of said cells in said one of said blocks.

2. A programmable logic device as in claim 1 in which said blocks comprise a 4×4 array of cells, and multiplexers in cells of said 4×4 array are connected to switches such that multiplexers on one diagonal of said 4×4 array connect to switches located north and south of said cells, and multiplexers on the other diagonal of said 4×4 array connect to switches located east and west of said cells;

whereby said multiplexers allow a 4-line bus to turn a 90-degree corner in said block.

* * * * *